(12) United States Patent
Lee et al.

(10) Patent No.: US 6,781,424 B2
(45) Date of Patent: Aug. 24, 2004

(54) SINGLE CHIP CMOS TRANSMITTER/RECEIVER AND METHOD OF USING SAME

(75) Inventors: Kyeongho Lee, Seoul (KR); Deog-Kyoon Jeong, Seoul (KR); Joonbae Park, Seoul (KR); Wonchan Kim, Seoul (KR)

(73) Assignee: GCT Semiconductor, Inc., Santa Clara, CA (US)

( * ) Notice: Subject to any disclaimer, the term of this patent is extended or adjusted under 35 U.S.C. 154(b) by 7 days.

(21) Appl. No.: 10/253,534

(22) Filed: Sep. 25, 2002

(65) Prior Publication Data

US 2003/0020521 A1 Jan. 30, 2003

Related U.S. Application Data

(63) Continuation of application No. 09/709,637, filed on Nov. 13, 2000, now Pat. No. 6,483,355, which is a continuation-in-part of application No. 09/121,863, filed on Jul. 24, 1998, now Pat. No. 6,194,947, which is a continuation-in-part of application No. 09/121,601, filed on Jul. 24, 1998, now Pat. No. 6,335,952.
(60) Provisional application No. 60/164,874, filed on Nov. 12, 1999.

(51) Int. Cl.[7] .................................................. H04B 1/18
(52) U.S. Cl. ..................... 327/113; 455/226.2; 455/217; 375/345
(58) Field of Search ................................ 327/350, 359, 327/105, 100, 113, 355; 455/226.2, 217, 226.1; 330/254; 375/259, 316, 345

(56) References Cited

U.S. PATENT DOCUMENTS

| | | | |
|---|---|---|---|
| 4,731,590 A | 3/1988 | Saari | 330/278 |
| 4,755,774 A | 7/1988 | Heck | 332/18 |
| 5,012,142 A | 4/1991 | Sonntag | 327/158 |
| 5,175,729 A | 12/1992 | Borras et al. | 370/345 |
| 5,179,303 A | 1/1993 | Searles et al. | 327/277 |
| 5,180,994 A | 1/1993 | Martin et al. | 331/38 |
| 5,408,201 A | 4/1995 | Uriya | 331/2 |
| 5,418,815 A | 5/1995 | Ishikawa et al. | 375/216 |
| 5,438,591 A | 8/1995 | Oie et al. | 375/261 |
| 5,448,772 A | 9/1995 | Grandfield | 327/357 |
| 5,471,168 A | 11/1995 | Sevenhans et al. | 327/553 |
| 5,507,025 A | 4/1996 | Rodeffer | 455/266 |
| 5,555,182 A | 9/1996 | Galm | 702/69 |
| 5,584,062 A | 12/1996 | Meador et al. | 455/260 |
| 5,614,868 A | 3/1997 | Nielson | 331/1 A |
| 5,640,146 A | 6/1997 | Campana et al. | 455/54.1 |
| 5,650,754 A * | 7/1997 | Joshi et al. | 331/17 |
| 5,734,970 A | 3/1998 | Saito | 455/76 |
| 5,761,617 A | 6/1998 | Yonekura et al. | 455/343 |
| 5,794,119 A | 8/1998 | Evans et al. | 455/71 |

(List continued on next page.)

Primary Examiner—Dinh T. Le
(74) Attorney, Agent, or Firm—Fleshner & Kim, LLP

(57) ABSTRACT

A single chip RF communication system and method is provided including a transmitter and a receiver. The RF communication system in accordance with the present invention can include an antenna that receives/transmits RF signals, a PLL that generates multi-phase clock signals having a frequency different from a carrier frequency and a reference signal having the carrier frequency, a demodulation-mixer that mixes the received RF signals with the multi-phase clock signals having the frequency different from the carrier frequency to output signals having a frequency reduced relative to the carrier frequency, two stage amplification that amplifies a selected channel signal to a required dynamic level, and an A/D converting unit for converting the RF signals from the mixing unit into digital signals. The two stage amplification can provide the selected channel signal with sufficient gain, even when an adjacent channel signal is output by the demodulation mixer with greater amplitude or power.

36 Claims, 9 Drawing Sheets

U.S. PATENT DOCUMENTS

| | | | |
|---|---|---|---|
| 5,861,773 A | 1/1999 | Meyer | 329/304 |
| 5,872,810 A | 2/1999 | Philips et al. | 375/222 |
| 5,878,087 A | 3/1999 | Ichihara | 375/316 |
| 5,880,613 A | 3/1999 | Ishihara | 327/202 |
| 5,889,437 A | 3/1999 | Lee | 331/16 |
| 5,894,592 A | 4/1999 | Brueske et al. | 455/86 |
| 5,910,751 A * | 6/1999 | Winn et al. | 327/560 |
| 5,950,119 A | 9/1999 | McGeehan et al. | 455/302 |
| 5,963,855 A | 10/1999 | Lussenhop et al. | 455/226.2 |
| 6,029,059 A | 2/2000 | Bojer | 327/361 |
| 6,031,878 A * | 2/2000 | Tomasz et al. | 375/316 |
| 6,084,905 A | 7/2000 | Ishifuji et al. | 375/202 |
| 6,097,768 A | 8/2000 | Janesch et al. | 375/330 |
| 6,169,452 B1 | 1/2001 | Popescu et al. | 330/254 |
| 6,175,279 B1 | 1/2001 | Ciccarelli et al. | 330/296 |
| 6,194,947 B1 | 2/2001 | Lee et al. | 327/359 |
| 6,212,576 B1 * | 4/2001 | King | 395/566 |
| 6,404,277 B1 | 6/2002 | Lee et al. | 327/553 |

\* cited by examiner

FIG. 5A PRIOR ART
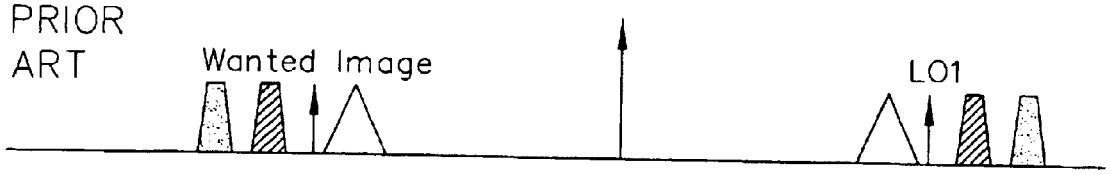
FIG. 5B PRIOR ART
FIG. 5C PRIOR ART
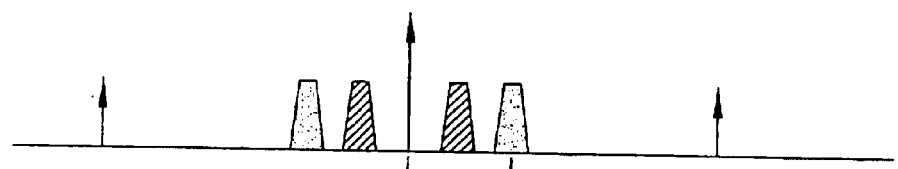
FIG. 5D PRIOR ART
FIG. 5E PRIOR ART
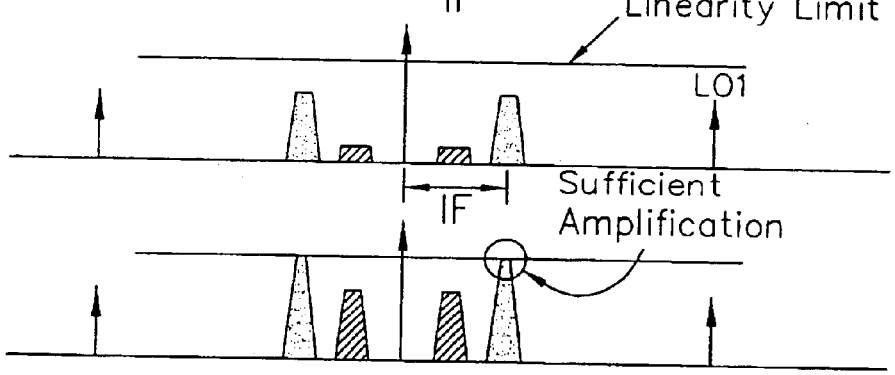
FIG. 5F PRIOR ART
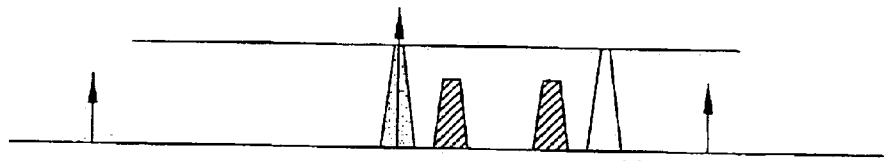
FIG. 5G PRIOR ART
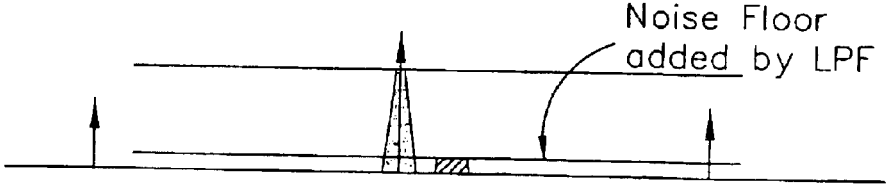

SINGLE CHIP CMOS TRANSMITTER/RECEIVER AND METHOD OF USING SAME

This application is a continuation of application Ser. No. 09/709,637, filed Nov. 13, 2000, U.S. Pat. No. 6,483,335, which is a continuation-in-part of application Ser. No. 09/121,863 filed Jul. 24, 1998, U.S. Pat. No. 6,194,947, and U.S. Pat. No. 09/121,601 filed Jul. 24, 1998, U.S. Pat. No. 6,335,952, and claims priority to Provisional Application No. 60/164,874 filed Nov. 12, 1999, the contents of which are incorporated by reference.

BACKGROUND OF THE INVENTION

1. Field of the Invention

The present invention relates to a communication system, and in particular, to a CMOS radio frequency (RF) communication system.

2. Background of the Related Art

Presently, a radio frequency (RF) communications system has a variety of applications including PCS communication and IMT systems. As such, a CMOS chip integration of the system has been pursued to reduce the cost, size and power consumption.

Generally, the RF communication system is composed of RF front-end block and base-band digital signal processing (DSP) block or baseband modem block. Currently, the base-band DSP block can be implemented with low cost and low power CMOS technology. However, the RF front-end cannot be implemented by CMOS technology because of limitations in speed, bandwidth and noise characteristics, which are below the speed, the frequency and noise specifications of popular RF communication systems.

For example, the PCS hand-phone systems operate at a frequency over 2.0 GHz, but current CMOS technology reliably operates only up to approximately 1.0 GHz in terms of speed and noise. Hence, the RF front-end block is implemented using bipolar, bi-CMOS or GaAs technology that has better speed, bandwidth and noise characteristics than CMOS technology but is more expensive and consumes more power.

Currently, two different types of RF architecture called "direct conversion" and super-heterodyne (double conversion) are used for CMOS RF communication systems. Both architectures have advantages and disadvantages in terms of CMOS implementations.

FIG. 1 is a diagram showing a related art direct conversion RF system 100. A related art direct conversion CMOS RF communication system 100 includes an antenna 105, a RF filter 110, a low noise amplifier (LNA) 120, a phase-locked loop (PLL) 130, a first mixer 140, a second mixer 142, first and second amplifiers 150, 152, a first low pass filter (LPF) 160, a second LPF 162, first and second variable gain amplifiers (VGA) 170, 172 each including automatic gain control (AGC) loops, a first analog/digital (A/D) converter 180, a second A/D converter 182, a third mixer 190 and a power amplifier 192.

The antenna 105 receives RF signals. The received RF signal is composed of various RF bands. Selected RF signals are then filtered at the RF filter 110. That is, out-of-band RF signals (e.g., irrelevant RF bands) are removed by the RF filter 110. The filtered in-band RF signals are amplified with a gain at the LNA 120. However, the in-band RF signal is composed of in-band channels and possible image bands, which is shown as A in FIGS. 1 and 2. The in-band RF signals passing through the LNA 120 are directly demodulated into base band signals by quadrature multiplication at the first and second mixers 140 and 142 because the LO frequency is equal to the carrier frequency. The PLL 130 preferably generates two types of clock signals, I clock signals and Q clock signals using a voltage controlled oscillator (VCO). The I clock signals and the Q clock signals are the same excepting a phase difference. The I signals preferably have a phase difference of 90 degrees from the Q signals. That is, Q signals are phase shifted with respect to quadrature phase shift I signals. The two sets of signals I and Q are preferably used to increase the ability of the RF system to identify or maintain received information regardless of noise and interference. Sending two types of signals having different phases reduces the probability of information loss or change.

As shown at B in FIGS. 1 and 2, the down converted signal includes the desired channel, adjacent channels and an up-converted signal. The down-converted signal is amplified by amplifiers 150, 152 before passing through corresponding low-pass filters (LPF) 160, 162 to prevent drastic signal-to-noise-ratio (SNR) degradation by noise injection from the LPFs 160, 162, which is shown as C in FIGS. 1 and 2. The signals from the LPFs 160, 162 are amplified by variable gain amplifiers (VGAs) 170, 172, respectively, and become respective signals required for A/D conversion at first and second A/D converters 180, 182. However, the desired channel cannot be amplified to a maximum level allowed by the linearity limit because the adjacent channel can reach the linearity limit before the desired channel is amplified to the required level. Thus, in the related art direct conversion architecture 100, amplification of the entire channel is reduced as the adjacent channel power increases, which also results in SNR degradation. As shown at D in FIGS. 1 and 2, the LPFs 160, 162 output a large noise floor that is added to the desired channel by the LPFs 160, 162. Accordingly, both the desired channel and the noise floor are amplified when the desired channel is amplified to the required level before the A/D conversion as shown at E in FIGS. 1 and 2.

The digital signals are then transferred to a base-band discrete-time signal processing (DSP) block (not shown). Channel selection is performed by changing frequency $f_0$ in at the phase-locked loop (PLL) 130.

As described above, the related art direct conversion RF system 100 has advantages for CMOS RF integration because of its simplicity. In the related art direct conversion RF system only a single PLL is required. Further, in the related art direct conversion RF system high-quality filters are not required. However, the related art direct conversion architecture has disadvantages that make single chip integration difficult or impossible. As shown in FIG. 3A, clock signals cos $\omega_{LO}t$ from a local oscillator (LO) such as the VCO may leak to either the mixer input or to the antenna where radiations can occur because the local oscillator (LO) is at the same frequency as the RF carriers. The unintentionally transmitted clock signals $\Delta(t)$ cos $\omega_{LO}t$ can reflect off nearby objects and be "re-received" by the mixer again. The low pass filter outputs a signal $M(t)+\Delta(t)$ because of leakages of clock signals. As shown in FIG. 3B, self-mixing with the local oscillator results in problems such as time variations or "wandering" DC-offsets at the output of the mixer. The time-varying DC-offset together with inherent circuit offsets significantly reduce the dynamic range of the receiver portion. Further, as discussed above, a related art direct conversion RF system requires a high-frequency, low-phase-noise PLL for channel selection, which is difficult to achieve with an integrated CMOS voltage controlled oscillator (VCO).

FIG. 4 shows a block diagram of a related art RF communication system 400 according to a double conversion architecture that considers all of the potential channels and frequency translates them first from RF to IF and then from IF to baseband using a tunable channel select PLL. As shown in FIG. 4, the RF communication system 400 includes antenna 405, a RF filter 410, a LNA 420, IR filter 425, a phase lock loop (PLL) PLL1 430, a first mixer 435, a IF filter 440, IF VGA 450, a PLL2 460, a second mixer 465, a LPF 470, an A/D converter 480, a third mixer 490 and a power amplifier 492.

The mixers 435, 465 are all for demodulation while the mixer 490 is for modulation. The mixer 435 is for a selected RF frequency and the mixer 465 is for an intermediate frequency (IF). The PLL1 430 generates clock signals at a high frequency or the RF frequency, the PLL2 460 generates clock signals having a low frequency or the intermediate frequency (IF).

Transmission data are multiplied with the clock signals having the high frequency from the PLL 430 to have an original transmission data frequency by the mixer 490. The output signals of the mixer 490 are amplified with a gain at the power amplifier 492 and then radiated through the antenna 405 for transmission.

Operations of the related art super-heterodyne receiver will now be described. Initially, an RF signal is received by the antenna 405. The received RF signal includes various RF bands. The RF filter 410 filters out out-of-band RF signals and the LNA 420 amplifies the in-band RF signal composed of in-band signals and possible image bands as shown at A in FIGS. 4–5. Image bands are filtered out by the image rejection (IR) filter 425 as shown at B in FIGS. 4–5. Otherwise, the image bands are mixed with the in-band RF signal after a first down conversion by the mixer 435 and PLL1 430 combination. Thus, the in-band RF channels are down converted into an IF frequency by a first down conversion at mixer 435 using a local oscillator signal LO1 as shown at C in FIGS. 4–5. The PLL1 430 generates the local oscillator signals for I signals of the RF signals and for Q signals of the RF signals.

The band-pass IF filter 440 rejects adjacent channels so that only the desired or dedicated channel has a dominant power level at the IF frequency as shown at D in FIGS. 4–5. The IF VGA 450 that includes an AGC loop amplifies the dedicated channel at the IF frequency to get an amplitude sufficiently large to overcome a large noise floor of the downstream LPF 470. The AGC loop continuously detects the amplitude of the IF VGA 450 output and controls its VGA gain so that a maximum amplitude allowed by the linearity limit can be obtained. As a result, the dual-conversion receiver can achieve the required SNR by the IF-filtering and amplification as shown at E in FIGS. 4–5. An adjacent channel is not a bottleneck or problem of IF amplification because of filtering by IF filter 440 before the IF amplification is performed by the IF VGA 450. However, if the adjacent channel is not eliminated before the IF amplification, the dedicated channels cannot be amplified to a maximum value because the adjacent channel can reach the linearity limit before the dedicated channel is amplified to the maximum level.

The amplified RF signal is down-converted again into the baseband by the second down-converting mixer 465 and using a local oscillator signal LO2 from the PLL2 460 as shown at F in FIGS. 4–5. The low-pass filter 470 filters out the up-converted signal and remaining adjacent channels as shown at G in FIGS. 4–5, which indicates the noise floor added by the LPF 470. The A/D converter 480 converts the signals into digital data, which is then transferred into a baseband discrete-time signal processing (DSP) block (not shown). All of the channels at the IF stage are frequency-translated directly to baseband frequency by the tunable PLL2 460 for channel selection.

As described above, the related art super-heterodyne RF system 400 has various advantages. The related art double conversion RF system 400 performs the channel tuning using the lower-frequency (i.e., IF) second PLL 460, but not the high-frequency, (i.e., RF) first PLL 430. Consequently, the high-frequency RF PLL 430 can be a fixed-frequency PLL that can be more effectively optimized. Further, since channel tuning is performed with the IF PLL 460, which operates at a lower frequency, the contribution of phase noise into channel selection can be reduced. However, the related art double conversion RF system 400 has various disadvantages to overcome for single chip integration. The related art double conversion RF system 300 uses two PLLs, which are difficult to integrate in a single chip. Further, the frequency of first PLL remains too high to be implemented with CMOS technology, and in particular, with a CMOS VCO. In addition, self-mixing problem still occurs because the second PLL is at the same frequency of the IF desired carrier. The output signals of the second mixer may leak to a substrate or may leak to the second mixer again. The time-varying DC-offset, together with inherent circuit offsets significantly reduces the dynamic range of the receiver portion. In addition, CMOS integration of an IR filter and an IF filter is very difficult or impossible.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

An object of the present invention is to provide a single chip CMOS transmitter/receiver and method that substantially obviates one or more problems and disadvantages of the related art.

A further object of the present invention is to fabricate a CMOS RF front end and method for using same that allows one chip integration of an RF communication system.

Another object of the present invention is to provide an RF communication system and method with reduced cost and power requirements.

Still another object of the present invention is to provide a reliable high speed, low noise CMOS RF communication system and method for using same.

Another object of the present invention is to increase a frequency range of a RF front end of an RF communication system.

Another object of the present invention is to provide a direct conversion RF communication system and method that provides a prescribed SNR regardless of an adjacent channel power level.

Another object of the present invention is to provide a baseband structure for a CMOS RF receiver on a single chip using selective two step amplification to meet desired gain for a selected RF channel and remove a larger adjacent channel.

To achieve at least the above objects and advantages in whole or in part, and in accordance with the purpose of the present invention, as embodied and broadly described, there is provided a direct conversion communication system that includes a receiver unit that receives signals including selected signals having a carrier frequency, a demodulation-mixer that mixes the received carrier frequency selected signals and that outputs baseband selected signals, and a baseband amplification circuit that includes first and second stage AGC amplifiers that receive the baseband selected signals and that selectively amplify in-channel signals to a prescribed amplitude.

To further achieve the objects in whole or in part, and in accordance with the purpose of the present invention, there is provided a single chip RF communication system, that includes a transceiver that receives and transmits RF signals, a PLL for generating a plurality of 2N-phase clock signals having a substantially identical frequency $2*f_0/N$, wherein $f_0$ is the carrier frequency, and wherein N is a positive integer, a demodulation mixer that mixes the RF signals from the transceiver with the plurality of 2N-phase clock signals from the PLL to output RF signals having a frequency reduced relative to the carrier frequency $f_0$, wherein the demodulation mixer comprises a plurality of two input mixers, an AGC loop coupled to the demodulation-mixer, a gain-merged filter coupled to the AGC loop, and an A/D converting unit coupled to the gain-merged filter that converts the RF signals from the demodulation mixer into digital signals.

To further achieve the objects of the invention, in whole or in part, and in accordance with the purpose of the present invention, there is provided a method of operating a RF communication system that includes receiving signals including selected signals having a carrier frequency, generating mote than two multi-phase clock signals having a substantially identical frequency different from the carrier frequency, mixing the received selected signals with the more than two multi-phase clock signals to output demodulated selected signals having a frequency reduced from the carrier frequency, wherein several of the more than two multi-phase clock signals are mixed to demodulate one of a first carrier frequency signal and a second carrier frequency signal, amplifying the demodulated selected signals until one of a selected channel and an adjacent channel reach a linearity limit and amplifying and filtering the adjacent channel and amplifying the selected channel to a desired dynamic range.

To further achieve the objects of the invention, in whole or in part, and in accordance with the purpose of the present invention, there is provided a system for demodulating communications signals including a mixer which mixes a received signal with an oscillator signal, a first amplifier which amplifies first and second signals output from the mixer, the first signal lying within a desired channel and the second signal lying within another channel, and a filter which suppresses the second signal without suppressing the first signal, the filter being positioned after the first amplifier along a signal path.

To further achieve the objects of the invention, in whole or in part, and in accordance with the purpose of the present invention, there is provided a method for demodulating communications signals including mixing a received signal with an oscillator signal, amplifying first and second signals output from the mixer in a first amplifier, the first signal lying within a desired channel and said second signal lying within another channel, and suppressing the second signal without suppressing the first signal, the suppressing step being performed after the amplifying step.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein:

FIGS. 5A–5G are diagrams showing signal propagation in the system of FIG. 4;

DETAILED DESCRIPTION OF PREFERRED EMBODIMENTS

A single chip radio frequency (RF) communication system formed using CMOS techniques should satisfy the following operative requirements. A CMOS voltage controlled oscillator (VCO) has poor noise characteristics. Accordingly, a CMOS phase-locked loop (PLL) integration is required. However, the number of PLL should be small and the center frequency of a PLL preferably differs sufficiently from a transmitting RF frequency (e.g., is preferably low enough) to control a phase noise result using the CMOS VCO. High-quality filters are preferably eliminated because of associated disadvantageous area and power specifications in CMOS configurations. Also, a number of components in the CMOS RF system should be small or reduced without performance degradation.

Figure 1:
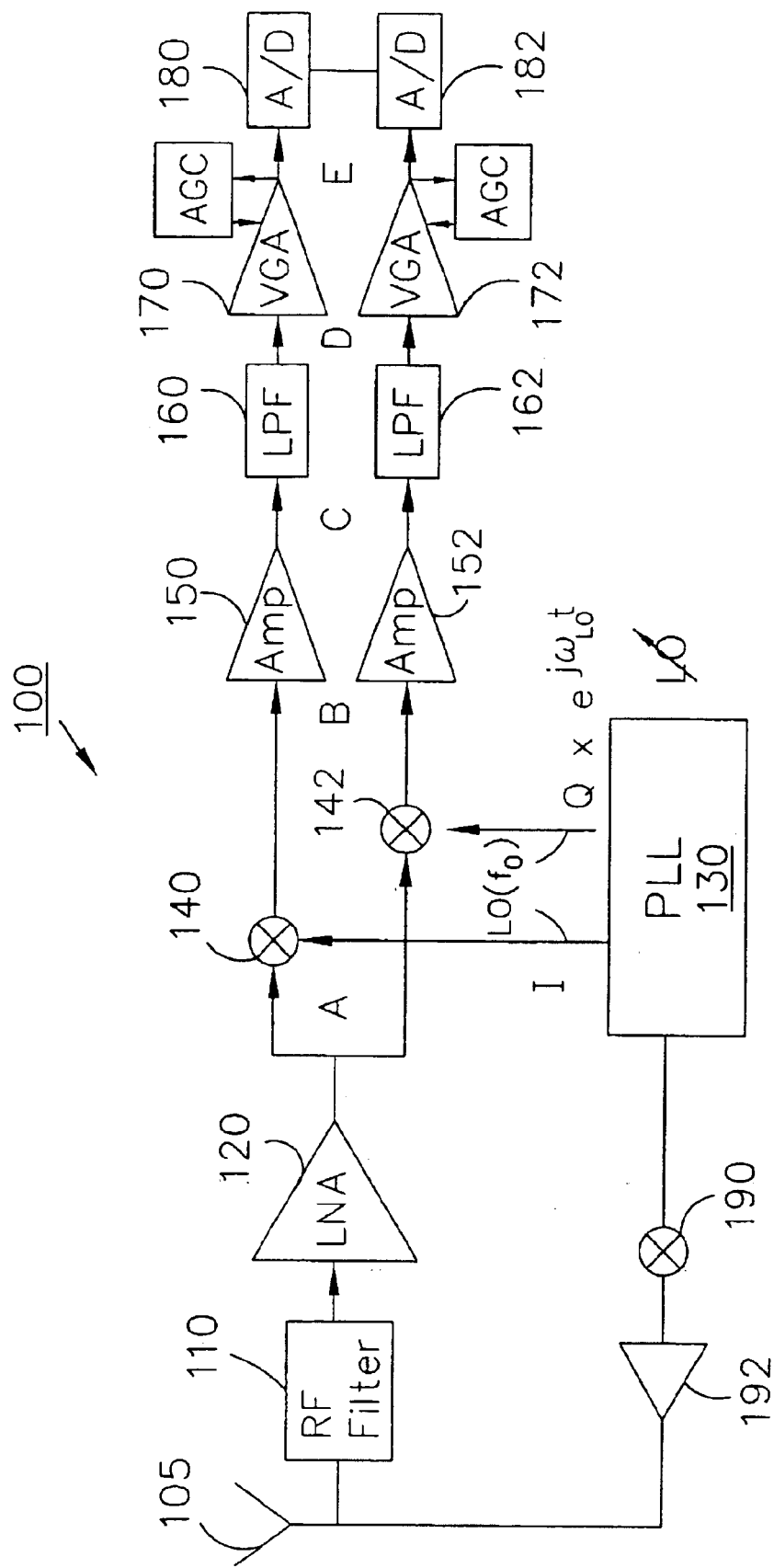
FIG. 1 is a circuit diagram showing a related art RF communication system.
Figure 2A:
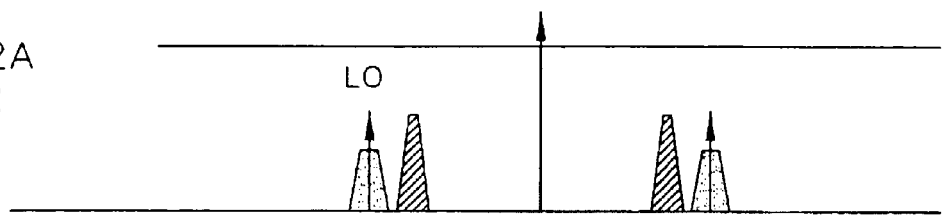
FIGS. 2A–2E are diagrams showing signal propagation in the system of FIG. 1.
Figure 2B:
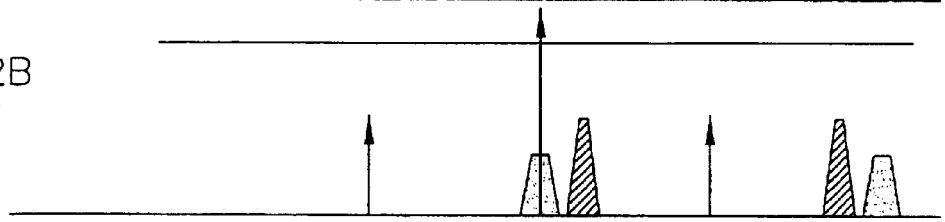
Figure 2C:
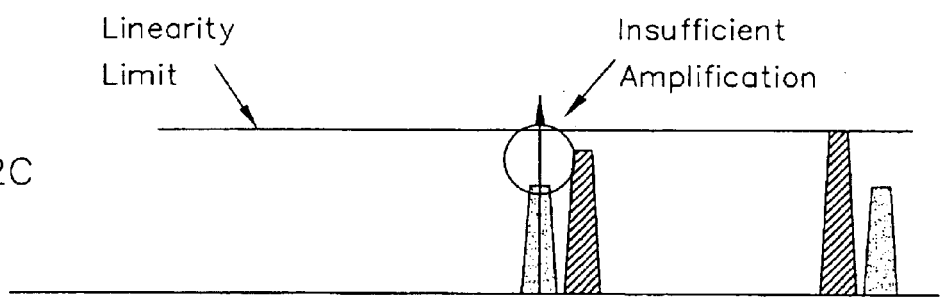
Figure 2D:
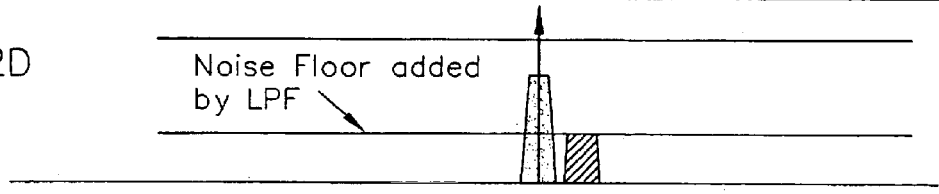
Figure 2E:
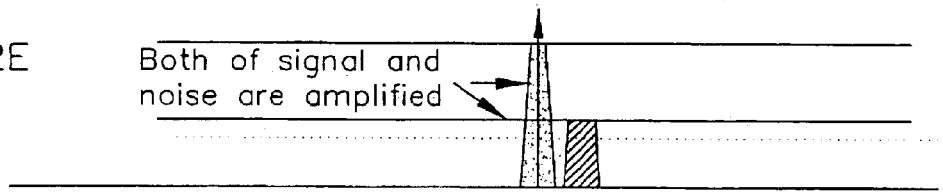
Figure 3A:
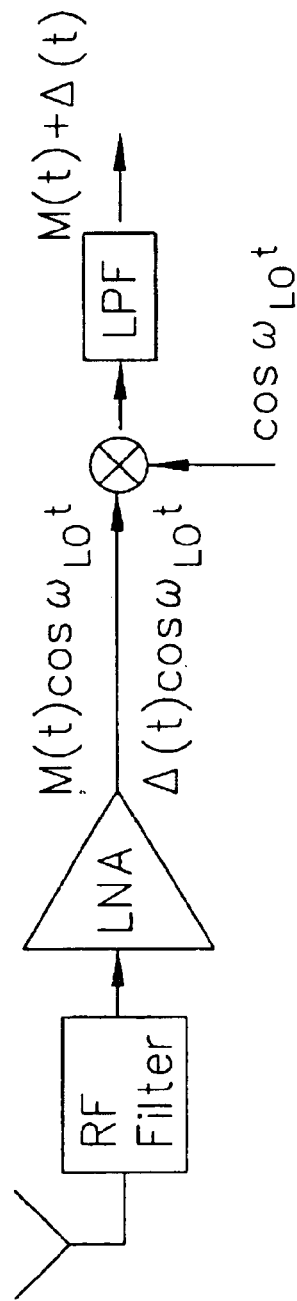
FIGS. 3A and 3B are diagrams showing clock signal leakage in the system of FIG. 1.
Figure 3B:
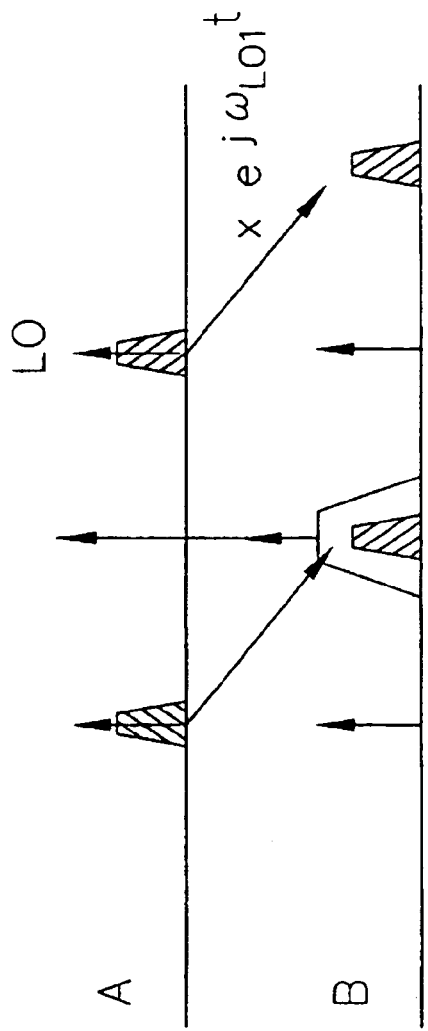
Figure 4:
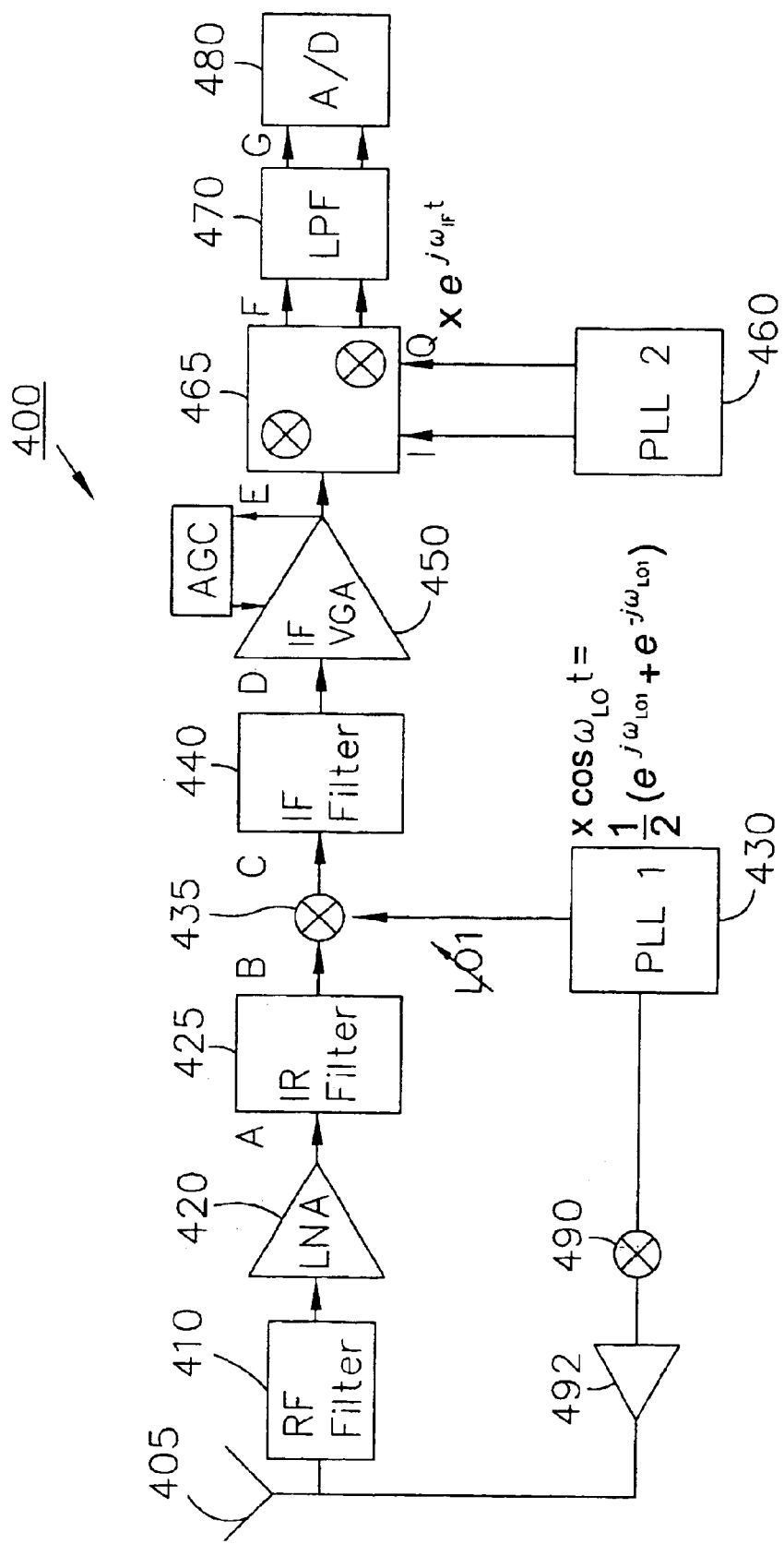
FIG. 4 is a circuit diagram showing another related art RF communication system.
Figure 6:
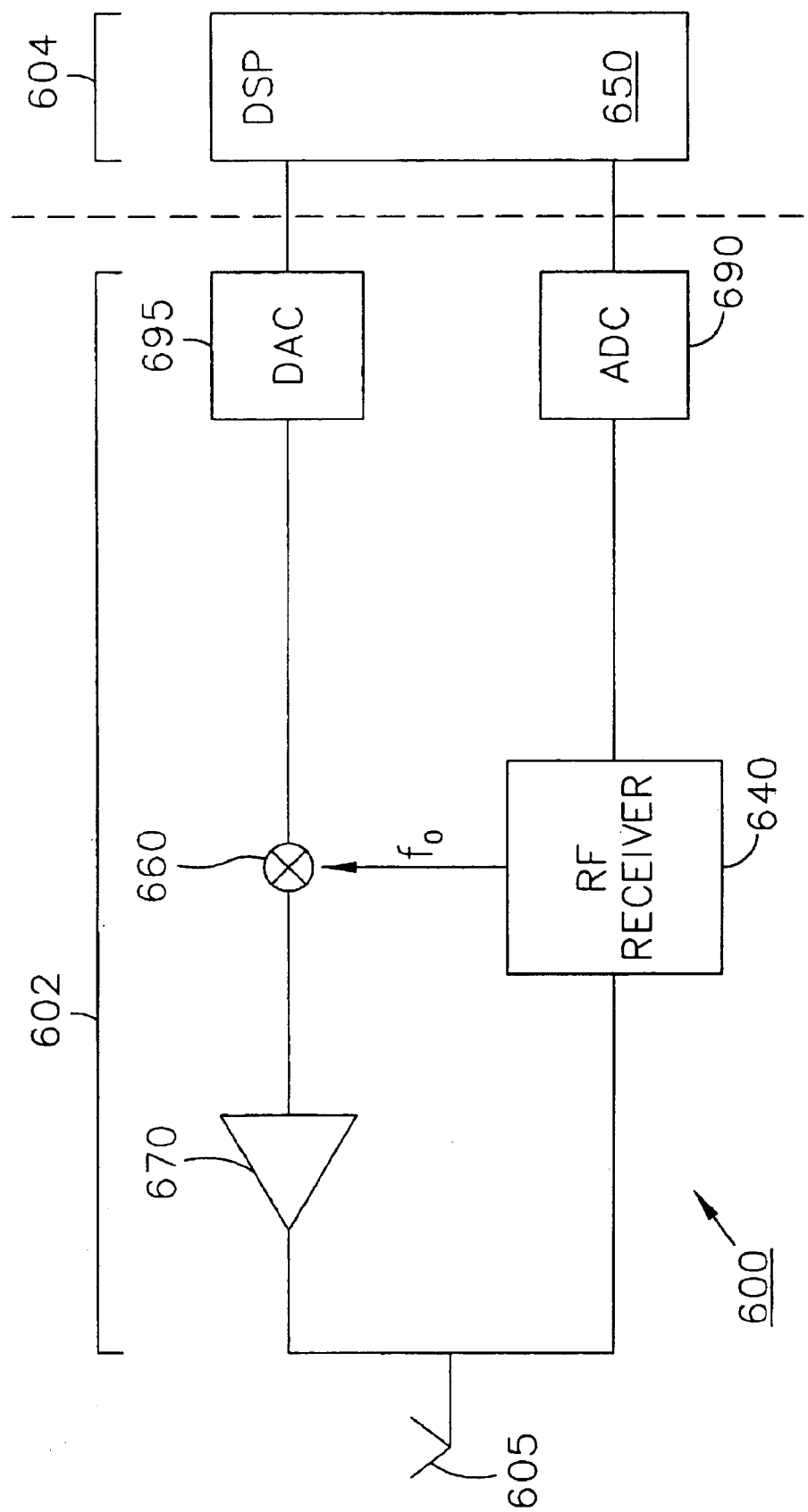
FIG. 6 is a diagram showing a preferred embodiment of a multi-phase, reduced frequency (MPRF) RF communication system according to the present invention.

A first preferred embodiment of a "multi-phase reduced frequency" (MPRF) conversion RF communication system 600 is shown in FIG. 6 and can preferably be formed on a single CMOS chip. The first preferred embodiment can operate at frequencies well above 1 GHz such as 1.8–2.4 GHz. The phrase "multi-phase reduced frequency conversion" is used because a single-phase periodic signal having a high frequency is preferably obtained by combining or multiplying multi-phase low-frequency periodic signals together. The first preferred embodiment of the MPRF conversion RF communication system 600 includes a front-end MPRF RF block 602 and a digital signal processing (DSP) block 604, which is preferably base-band. As discussed above, related art DSP blocks can be formed using CMOS techniques. Accordingly, a detailed explanation of the DSP block 604 including a digital signal processor 650 will be omitted.

The MPRF conversion RF block 602 includes an antenna 605, an RF receiver portion 640, analog/digital (A/D) converter 690, D/A converter 695, a power amplifier 670 coupled between a mixer 660 and the antenna 605. The receiver portion 640 generates a modulating and de-modulating clock, i.e., local oscillator (LO), whose frequency $f_0$ is determined by a reference clock.

Figure 7:
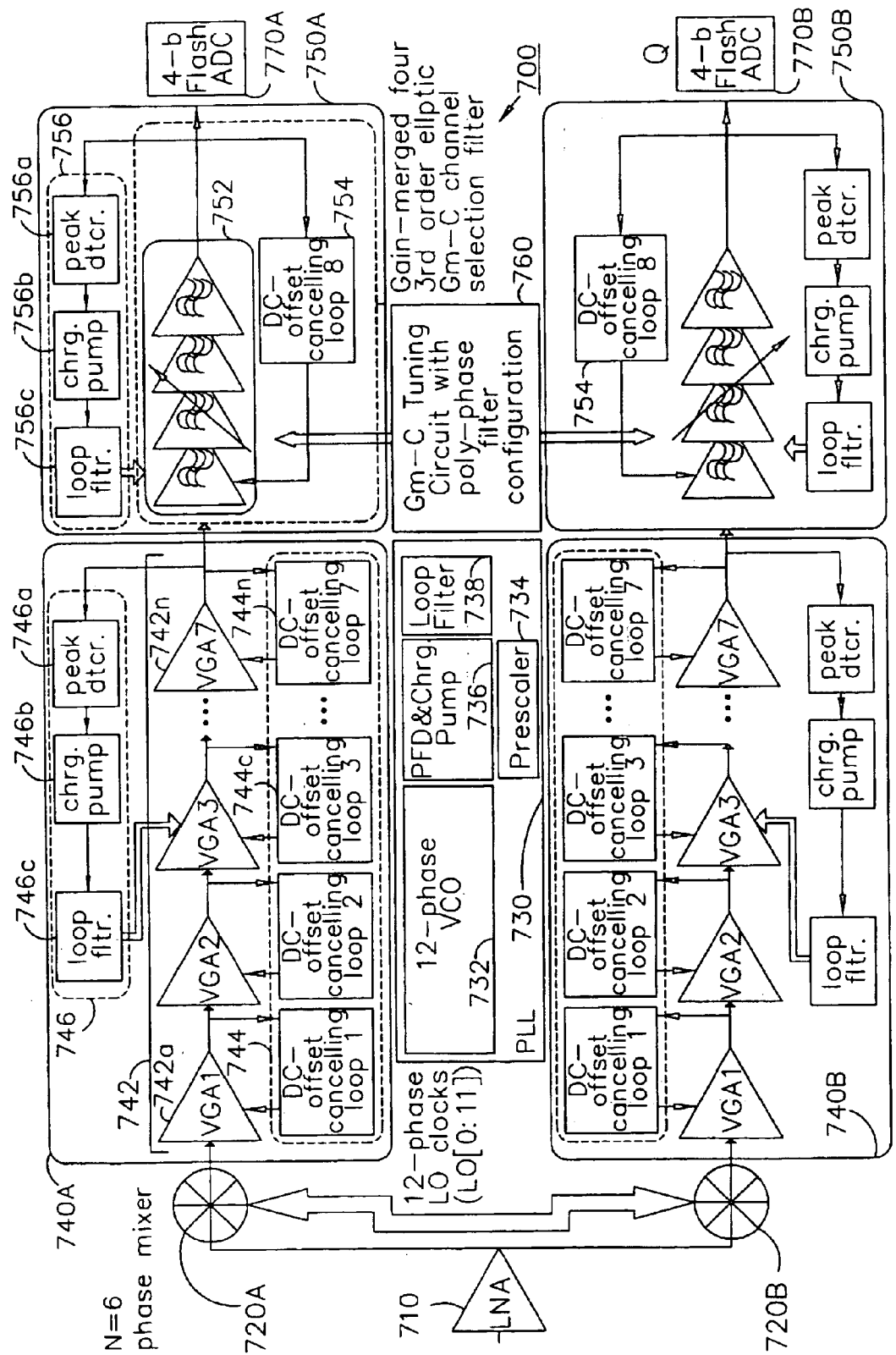
FIG. 7 is a block diagram showing a receiver of a RF communication system according to a preferred embodiment of the present invention.

FIG. 7 shows a block diagram of a first preferred embodiment of a receiver 700, which can operate as the receiver portion 640. As shown in FIG. 7, the receiver 700 includes a full-CMOS low noise amplifier 710, a N-phase mixer 720A, 720B, a PLL generating multi-phase (e.g., 800 MHz) LO signals (e.g., LO[0:11]) 730, a variable gain amplifier (VGA) with a first automatic gain control (AGC) loop 740A, 740B, a gain-merged (e.g., four 3rd order Gm-C elliptic filter) filter with a second AGC loop 750A, 750B, a Gm-C tuning circuit with a poly-phase filter configuration 760. Each of an I-channel and a Q-channel signal is coupled to analog-to-digital converter (e.g., 4-bit flash ADC) 770A, 770B, respectively.

The PLL 730 preferably includes a N-phase voltage controlled oscillator (VCO) 732, a phase frequency detector (PFD) and charge pump 736, a loop filter 738 and a prescaler 734. The VCO 732 is preferably a multiple feedback loop VCO where each VCO cell of the VCO 732 preferably includes short rise/fall times and a large swing to obtain a phase noise reduced sufficiently for a wideband 2.4 GHz CDMA application. The prescaler 734 is preferably a multi-phase sampling fractional-N prescaler that performs fractional-N operations while preventing a fractional spur inside the channel bandwidth. Thus, the PLL 730 incorporates a bandwidth sufficient for a low phase noise 2.4 GHz W-CDMA without the fractional spur inside the channel bandwidth.

As shown in FIG. 7, the PLL 730 generates 12-phase LO signals (LO[0:11]) for seven different channel frequencies. The N-phase mixer is preferably a quadrature down converter and as shown in FIG. 7 includes two six-phase single-balanced mixers 720A, 720B where one is for the I-channel and the other is for the Q-channel. For example, as shown in FIG. 7, the six-phase mixer 720A receives 800 MHz six-phase LO signals (LO[0, 2, 4, 6, 8, 10]) for the I-channel and the six-phase mixer 720B receives 800 MHz six-phase LO signals (LO[1, 3, 5, 7, 9, 11]) for the Q-channel. Accordingly, the 12-phase quadrature down converter 720 provides the function of a single-balanced mixer that receives a single-phase 2.4 GHz LO signal. In this example, the mixers 720A, 720B permit the CMOS VCO to provide multi-phase clock signals at a frequency $2f_0/N$ (e.g., one-third) of the carrier frequency $f_0$. Accordingly, a dominant power of the LO and its associated leakage is not at 2.4 GHz (the carrier frequency) because the VCO 732 is operating at 800 MHz. Thus, in the first preferred embodiment of the receiver 700, an amount of DC-offset can be drastically reduced due to the $2*f_0/N$ frequency of the VCO 732.

As shown in FIG. 7, the mixers 720A, 720B output baseband RF signals. A baseband structure of the receiver 700 includes the first AGC loop 740A and the second AGC loop 750A. The AGC loop 740A includes—VGA stages (e.g., n=7) 742a, 742b, ..., 742n, a cascaded DC-offset canceling loop 744 having—DC-offset canceling loops 744a, 744b, ..., 744n (e.g., n-7) and a first feedback loop 746. Additional description of the automatic gain loop control apparatus is provided in co-pending U.S. application Ser. No. 09/705,696, filed Nov. 6, 2000, the contents of which are hereby incorporated by reference. The second AGC loop 750A includes a gain-merged four 3rd order Gm-C elliptic filter 752, a DC-offset canceling loop 754 and a second feedback loop 756. The first AGC loop preferably enables the desired channel to achieve the maximum gain before the channel selection filter in a case where there is a large adjacent channel condition. The second AGC loop preferably compensates gain lost for the desired channel because of the large adjacent channel blocker. The baseband structure first AGC loop 740B and the second AGC loop (with filter) 750B of the receiver 700 for the Q channel have a similar configuration to the I channel. Each of the feedback loops include a peak detector 746a, 756a, a charge pump 746b, 756b and a loop filter 746c, 756c.

Figure 8:
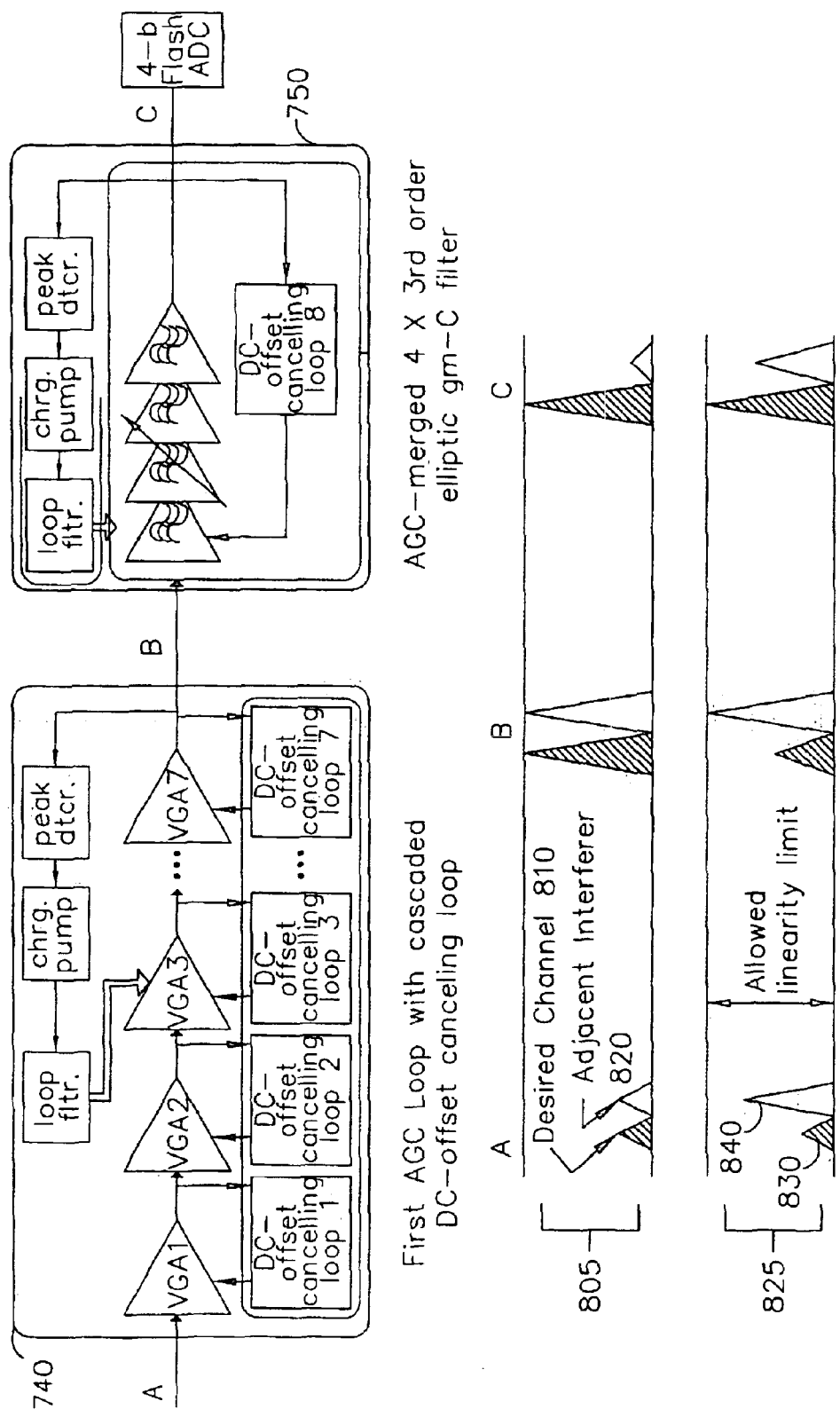
FIG. 8 is a block diagram showing signal flow of the RF communication system of FIG. 7.

FIG. 8 is a diagram that illustrates signal flow of the baseband structure of the receiver 700. As shown in FIG. 8, two different conditions are illustrated. In a first condition, an input RF signal 805 is received from the mixer 720 where the adjacent channel power 820 is smaller than or equal to power of the desired channel 810. Preferably, according to the first preferred embodiment of the receiver 700, the desired channel obtains the required gain primarily from the first AGC loop 740. In a second condition, an input RF signal 825 is received from the mixer 720 where the adjacent channel power 840 is greater than (e.g., substantially larger) than the desired channel 830. When the RF signal 825 is received, the first AGC loop 740 amplifies the desired channel 830 until the adjacent channel power 840 reaches the allowed linearity limit. In the second AGC loop 750, the AGC loop is merged in a Gm-C channel selection filter that amplifies the desired channel to the desired level limited by the allowed linearity limit. By selectively controlling the conditions and operations of the first and second (e.g., cascaded) AGC loops 740, 750, an RF signal in the desired channel can still receive a maximum gain available to the RF signal 805 even when the RF signal 825 is received. Thus, the first preferred embodiment of the baseband structure of the receiver 700 obtains a gain provided by a dual-conversion receiver.

In addition, the output signal outputted from the last VGA of the VGA loop in the first AGC loop, is inputted back to VGA 3 as shown in FIG. 8. However, the present invention is not intended to be so limited. For example, the output signal could also be looped back to a different one of the previous VGAs in the VGA loop such as VGA 1 or all the VGA stages.

Figure 9:
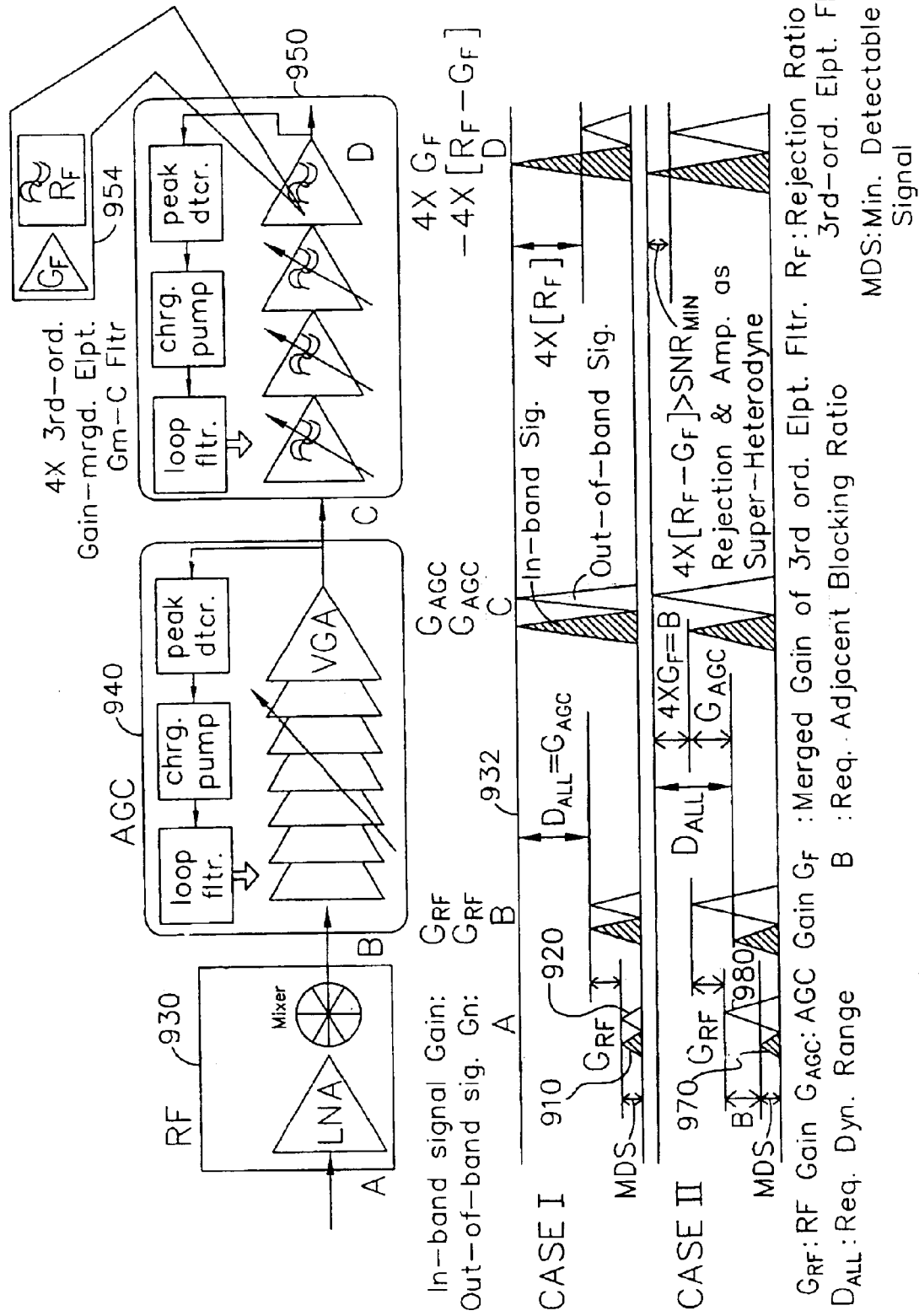
FIG. 9 is a block diagram showing a receiver of a RF communication system according to another preferred embodiment of the present invention.

FIG. 9 is a diagram that illustrates gain distribution of the receiver 700. As shown in FIG. 9, case I illustrates the conditions where the amplitude of an adjacent channel blocker is equal (e.g., or less than) to the in-band signal. As shown in FIG. 9, a received in-band signal 910 has a value being a minimum detectable signal (MDS). Similarly, an adjacent channel blocker 920 has an initial value being the MDS. As shown in case I of FIG. 9, both of the in-band signal 910 and the out-of-band signal 920 receive a gain of $G_{RF}$ dB (decibels) by an RF stage 930. In a preferred embodiment, the RF stage 930 includes the LNA 710 and N-phase mixer 720. Thus, as shown at point B of case I in FIG. 9, the in-band and out-of-band signals 910, 920 are signals having (MDS+$G_{RF}$) dB at an output terminal of the mixer 720. $G_{RF}$ is defined as an RF gain provided by an RF section 930.

The AGC 940 is a first stage AGC that amplifies both the in-band signal 910 and the out-of-band signal 920 until the dedicated linearity limit 932. In case I, the adjacent channel blocker (e.g., out-of-band signal 920) cannot prohibit the in-band signal 910 from receiving sufficient amplification. Thus, both the in-band and out-of-band signals 910, 920 are amplified up to (MDS+$G_{RF}$+$G_{AGC}$) dBm at an output terminal of the first AGC loop stage 940. $G_{AGC}$ is the AGC gain by the first AGC loop 940. Accordingly, in the second AGC loop 950 in case I shown in FIG. 9, the in-band signal is preferably not amplified because a sufficient amplification was previously achieved to meet the dedicated signal level for the receiver 700. Preferably, the first AGC loop stage 940 achieves the amplification. However, in the second AGC loop 950, the adjacent channel blocker 920 is partially filtered to be reduced in amplitude. As shown in FIG. 9, in the second AGC loop 950, the adjacent channel blocker 920 is rejected preferably by a filter rejection ratio (e.g., 4×$R_F$) in the filter stage without amplification because $G_F$ is set to 0 by the second AGC loop 950. $G_F$ is the merged gain of a 3rd order elliptic filter of the second AGC loop 950 and $R_F$ is the rejection ratio of 3rd order elliptic filter. In summary, in case I as shown in FIG. 9, the gain of the VGA preferably included in the first AGC loop sufficiently covers the required dynamic range $G_{AGC}=D_{ALL}$. In the single chip CMOS RF receiver, $D_{ALL}$ is a required dynamic range to transfer the in-band signal. Thus, in case I of FIG. 9, $G_{AGC}$ and equal $D_{ALL}$.

As shown in case II in FIG. 9, the amplitude of the adjacent channel blocker 980 is larger than the in-band signal 970 by BdB, which is the required adjacent channel blocking ratio. As shown in case II of FIG. 9, the MDS dBm of in-band signal 970 and the (MDS+B) dBm of the out-of-band signal 980 are applied to the RF stage 930. Accordingly, at an output terminal of the RF stage 930 (e.g., mixer output), the in-band signal 970 has a gain of (MDS+$G_{RF}$) dBm and the out-of-band signal 980 has a gain of (MDS+B+$G_{RF}$) dBm. In case II, the VGA of the first AGC loop 940 preferably amplifies both signals 970, 980 until the amplitude of the adjacent channel blocker 980 reaches the linearity limit 932. As a result, at the output of the first AGC loop 940 (e.g., VGA output terminal), the in-band signal 970 has a gain of (MDS+$G_{RF}$+$G_{AGC}$) dBm and the out-of-band signal 980 has a gain of (MDS+$G_{RF}$+$G_{AGC}$+B) dBm. Relative to the case I of FIG. 9, the VGA gain $V_{AGC}$ (case II) is smaller than the VGA gain $V_{AGC}$ (case I) by B dB. In the second AGC loop 950 for case II of FIG. 9, the gain-merged-filter stage 954 preferably amplifies the in-band signal 970 by (4×$G_F$), which is preferably equal to the required blocking ratio, B dB. The out-of-band signal 980 is amplified by (4×$G_F$) and simultaneously rejected by (4×$R_F$) by the gain-merged-filter in the second AGC loop 950, which results in a total or net (4×($R_F$−$G_F$)) rejection. Accordingly, in a second preferred embodiment of the receiver baseband structure shown in FIG. 9, the required dynamic range is shared by the first AGC loop 940 (VGA) and the second AGC loop 950 (the gain-merged-filter) to provide the required dynamic range $D_{ALL}=G_{AGC}+4×G_F=G_{AGC}+B$.

Although the second preferred embodiment of the baseband structure shown in FIG. 9 indicates a first AGC loop followed by a second AGC loop 950, the present invention is not intended to be so limited. Thus, the second AGC loop 950 could be sequentially provided after a mixer of the RF section 930 prior to the first AGC loop 940. In such a case, the in-band RF signal would be first processed by preferably the Gm-C filter to block an adjacent channel prior to the gain from the first AGC loop 940 using preferably the VGA amplifiers.

As described above, the preferred embodiments of the CMOS receiver architecture and methods for using same have various advantages. In the preferred embodiments, a direct conversion receiver is provided having a SNR comparable to a super-heterodyne receiver. Further, in preferred embodiments of baseband structure and methods of using same according to the present invention a sufficient SNR is provided for an input signal regardless of an adjacent channel power level.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A system for demodulating communications signals, comprising:
    a mixer which mixes a received signal with an oscillator signal, said oscillator signal being at least substantially equal to a carrier frequency of the received signal;
    a amplifier which amplifies first and second signals output from the mixer, said first signal lying within a desired channel and said second signal lying within an adjacent channel, the amplifier increasing an amplitude of said second signal to a value substantially corresponding to a desired linearity limit and increasing an amplitude of said first signal to a value less than the desired linearity limit; and
    a gain controller which reduces the amplitude of said second signal and increases the amplitude of said first signal, said gain controller being positioned after the amplifier along a signal path.

2. The system of claim 1, wherein the gain controller increases the amplitude of said first signal to a value which corresponds to the desired linearity limit.

3. The system of claim 1, wherein the gain controller includes a filter and an amplifier circuit, said amplifier circuit increasing the amplitude of said first signal up to the linearity limit and said filter reducing an amplitude of said second signal by an amount which causes the amplitude of said second signal to be less than an amplitude of said first signal.

4. The system of claim 1, wherein the gain controller amplifies said first signal by a predetermined amount.

5. The system of claim 4, wherein said predetermined amount corresponds to the desired linearity limit.

6. The system of claim 1, wherein the amplifier includes an automatic gain control loop.

7. The system of claim 6, wherein the amplifier includes at least one DC-offset cancellation unit.

8. The system of claim 3, wherein the filter is an elliptic filter.

9. The system of claim 8, wherein the filter includes an N-order elliptic gm-C filter.

10. The system of claim 9, wherein the N-order elliptic gm-C filter is a $3^{rd}$-order elliptic gm-C filter.

11. The system of claim 1, further comprising:
    a phase-locked loop for generating the oscillator signal.

12. The system of claim 11, wherein the oscillator signal output from the phase-locked loop is a multi-phase oscillator signal corresponding to a predetermined number of channel frequencies, said predetermined number of channel frequencies including said desired channel.

13. The system of claim 12, wherein the phase-locked loop includes a volt age-controlled oscillator which generates the oscillator signal based on a combination of frequency signals each having a frequency less than the carrier frequency.

14. The system of claim 13, wherein the multi-phase oscillator signal includes multiple local oscillator signals each of which is set at frequencies less than the carrier frequency, and wherein a sum of the frequencies of the multiple local oscillator signals substantially equals the carrier frequency.

15. The system of claim 13, the phase-locked loop includes a prescaler which performs at least one fractional-N operation, while simultaneously preventing fractional spur from appearing inside a channel bandwidth of the phase-locked loop.

16. The system of claim 1, wherein the mixer, amplifier, and gain controller are implemented in CMOS.

17. The system of claim 1, wherein the mixer, amplifier, and gain controller are implemented on a single chip.

18. A direct-conversion receiver comprising the system as recited in claims 1 or 16.

19. The direct-conversion receiver of claim 18, wherein an operating frequency of the receiver lies above 1 GHz.

20. The direct-conversion receiver of claim 19, wherein the operating frequency lies within a range of between 1.8 and 2.4 GHz.

21. A method for demodulating communications signals, comprising:

mixing a received signal with an oscillator signal, said oscillator signal being at least substantially equal to a carrier frequency of the received signal;

amplifying first and second signals output from the mixer, said first signal lying within a desired channel and said second signal lying within an adjacent channel, said amplifying step including increasing an amplitude of said second signal to a value substantially corresponding to a desired linearity limit and increasing an amplitude of said first signal to a value less than the desired linearity limit; and reducing the amplitude of said second signal and increasing the amplitude of said first signal to a predetermined value.

22. The method of claim 21, wherein the predetermined value corresponds to the desired linearity limit.

23. The method of claim 21, wherein the reducing step includes reducing the amplitude of said second signal by an amount which causes the amplitude of said second signal to be less than an amplitude of said first signal.

24. The method of claim 21, wherein said predetermined value corresponds to the desired linearity limit.

25. The method of claim 21, further comprising:

cancelling DC-offset in said first and second signals amplified in the amplifying step.

26. The method of claim 21, wherein the reducing step is performed by an elliptic filter.

27. The method of claim 26, wherein the filter includes an N-order elliptic gm-C filter.

28. The method of claim 27, wherein the N-order elliptic gm-C filter is a $3^{rd}$-order elliptic gm-C filter.

29. The method of claim 21, further comprising:

generating the oscillator signal using a phase-locked loop.

30. The method of claim 29, wherein the oscillator signal output from the phase-locked loop is a multi-phase oscillator signal corresponding to a predetermined number of channel frequencies, said predetermined number of channel frequencies including said desired channel.

31. The method of claim 29, wherein the phase-locked loop includes a voltage-controlled oscillator which operates at a frequency less than the carrier frequency.

32. The method of claim 31, wherein the multi-phase oscillator signal includes multiple local oscillator signals each of which is set at frequencies less than the carrier frequency, and wherein a sum of the frequencies of the multiple local oscillator signals substantially equals the carrier frequency.

33. The method of claim 31, the phase-locked loop includes a prescaler which performs at least one fractional-N operation, while simultaneously preventing fractional spur from appearing inside a channel bandwidth of the phase-locked loop.

34. The method of claim 21, wherein the mixing, amplifying, reducing and increasing steps are performed in a direct-conversion receiver.

35. The method of claim 34, wherein the direct-conversion receiver has an operating frequency which lies above 1 GHz.

36. The method of claim 35, wherein the operating frequency lies within a range of between 1.8 and 2.4 GHz.

* * * * *